United States Patent [19]
Kugo

[11] Patent Number: 5,522,123
[45] Date of Patent: Jun. 4, 1996

[54] METHOD AND APPARATUS FOR ASSEMBLING ELECTRONIC COMPONENT

[75] Inventor: Daisaku Kugo, Nagaokakyo, Japan

[73] Assignee: Murata Manufacturing Co., Ltd., Japan

[21] Appl. No.: 201,882

[22] Filed: Feb. 24, 1994

[30] Foreign Application Priority Data

Feb. 26, 1993 [JP] Japan .................................. 5-062871

[51] Int. Cl.$^6$ ............................ H04R 17/00; B23P 11/02
[52] U.S. Cl. .......................... 29/25.35; 29/451; 29/594; 29/742
[58] Field of Search ................... 29/25.35, 451, 29/452, 594, 609.1, 238, 742, 757

[56] References Cited

U.S. PATENT DOCUMENTS

| | | | |
|---|---|---|---|
| 1,944,683 | 1/1934 | Doyle | 29/238 X |
| 3,724,739 | 4/1973 | Anderson et al. | 29/25.35 X |
| 4,764,690 | 8/1988 | Murphy et al. | 29/594 X |

FOREIGN PATENT DOCUMENTS 682171  11/1952  United Kingdom .................. 29/25.35

*Primary Examiner*—Peter Vo
*Assistant Examiner*—Khan V. Nguyen
*Attorney, Agent, or Firm*—Ostrolenk, Faber, Gerb & Soffen

[57] ABSTRACT

A method of and an apparatus for assembling an electronic component, such as a ladder-type filter, having a plurality of parts being held under pressure and stored in a case. First, the parts such as elements and terminal plates and the case are carried into a working area of a chuck unit. Next, the parts are chucked by the chuck unit and assembled in an assembly jig so as to be aligned along a direction of thicknesses thereof. Then, all parts in the assembly jig are compressed in the direction of thickness, and simultaneously inserted into the case. Thus, automatic assembly of an electronic component is realized so as to highly improve working efficiency.

14 Claims, 14 Drawing Sheets

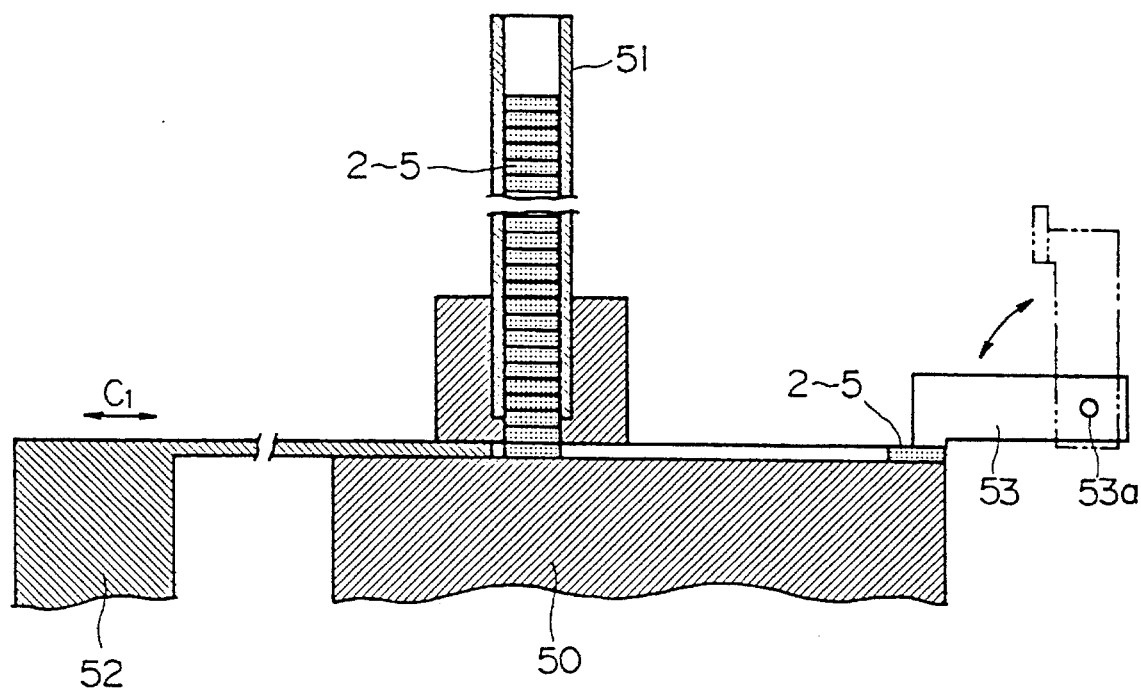

1

METHOD AND APPARATUS FOR ASSEMBLING ELECTRONIC COMPONENT

BACKGROUND OF THE INVENTION

The present invention relates to a method of and an apparatus for assembling an electronic component, such as a ladder-type filter, having a plurality of inner parts being held under pressure and stored in a case.

FIGS. 1 and 2 show a conventional four-element ladder-type filter. This filter comprises two series ceramic resonators 2 and 3, two parallel ceramic resonators 4 and 5, an input terminal plate 6, a ground terminal plate 7, an output terminal plate 8, an internal connection terminal plate 9 and a plate spring 10, which are stored in a box-type case 1. Outlines of these inner parts are substantially equivalent to each other. FIG. 3 is a circuit diagram showing the electrical connection thereof.

The input terminal plate 6 is provided on its one major surface with a protruding portion 6a which is in pressure contact with a central portion of the series resonator 2. The ground terminal plate 7 is provided on both its major surfaces with protruding portions 7a and 7b which are in pressure contact with central portions of the two parallel resonators 4 and 5 respectively. The output terminal plate 8 is provided on both its major surfaces with protruding portions 8a and 8b which are in pressure contact with central portions of the parallel resonator 5 and series resonator 3 respectively. The internal connection terminal plate 9 has a portion 9a which is inserted between the series resonator 2 and parallel resonator 4, a portion 9b which is arranged next to an outer major surface of the series resonator 3, and a coupling portion 9c which connects these portions 9a and 9b. Since the plate spring 10 is interposed between the portion 9b and an inner side surface of the case 1, the terminals 6–9 and the resonators 2–5 are in pressure contact with each other to be electrically connected.

A cover sheet 11 is inserted in an opening of the case 1, and a cavity which is defined by the cover sheet 11 and the opening is filled up with filler 12 such as resin, whereby the opening of the case 1 is sealed. Lead portions 6b, 7c and 8c of the input terminal 6, the ground terminal 7 and the output terminal 8 protrude from the opening of the case 1.

In the conventional ladder-type filter having the aforementioned structure, the resonators 2–5 utilizing surface-directional spreading vibration mode are merely in point contact with the terminals 6–9 at the central protruding portions 6a, 7a, 7b, 8a and 8b. Therefore, it is necessary to manually insert the resonators 2–5 and the terminals 6–9 into the case 1 one by one with tweezers since these parts easily get slanted due to the point contact. As a result, working efficiency of the assembling operation becomes quite low. Further, since it is necessary to bring all parts into close contact with each other in the final stage of assembly, much time is required for inserting the final part into a very small clearance. Moreover, electrode surfaces of the resonators 2–5 may be damaged by the assembling operation.

Thus, the conventional method of assembling electronic component such as a ladder-type filter had a problem of low working efficiency caused by manual assembly.

SUMMARY OF THE INVENTION

Accordingly, an object of the present invention is to provide a method of and an apparatus for assembling an electronic component, by which automatic assembly can be performed so as to improve working efficiency.

Another object of the present invention is to provide a method of and an apparatus for assembling an electronic component, by which parts will not be damaged in the assembling operation.

In the method of the present invention, first the parts such as terminal plates, a cushion member, elements and a case are carried into a working area in which a chuck means is movable. An assembly means for assembling the parts is previously arranged in this working area. Next, the parts are chucked and inserted into the assembly means so as to be aligned along a direction of thicknesses thereof by the chuck means. If the preceding parts are inclined or slanted in the assembly means, the following parts cannot be smoothly inserted between the preceding parts. Therefore, the assembly means may preferably be able to hold the parts self-sustainably, and the chuck means may preferably be able to separate the preceding parts from each other so as to smoothly insert a following part therebetween.

After the parts are inserted in the assembly means, these parts are compressed along the direction of thickness so that the overall thickness of the parts is smaller than the inner size of the case. On the other hand, the case is carried to the assembly means by the chuck means, and set on a position in which the parts are inserted. Then, the parts are inserted from the assembly means into the case simultaneously, whereby no damage is caused on the surfaces of the parts since the parts are not in sliding contact with each other.

When the electronic component in the present invention comprises a plurality of terminal plates, an element, a cushion member and a case, a pallet for holding the terminal plates, the cushion member and the case respectively, and conveyor means for carrying the pallet into the working area may preferably be used. The pallet may have a plurality of cavities for holding the parts in a constant position so as to be easily chucked by the chuck means. The chuck means takes out the terminal plates, the cushion member and the case from the pallet and carries them to the assembly means. An element-supply means may preferably be arranged in the working area for supplying the element so as to be chucked by the chuck means. The chuck means may take out the element from the element-supply means and insert it between the terminal plates in the assembly means. According to this method, it is possible to easily cope with the variations of elements used in the components.

When the electronic component further comprises a cover sheet for covering an opening of the case, a cover sheet fitting means may preferably be arranged in the working area. The cover sheet fitting means may punch a tape to form the cover sheet and insert the cover sheet into the case so as to cover the opening. According to this method, all of the assembly operation from carrying the parts into the working area to assembling the cover sheet into the case can be automated.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8B is a sectional view showing an element-supply unit shown in FIG. 8A;

DESCRIPTION OF THE PREFERRED EMBODIMENTS

Figure 4A:
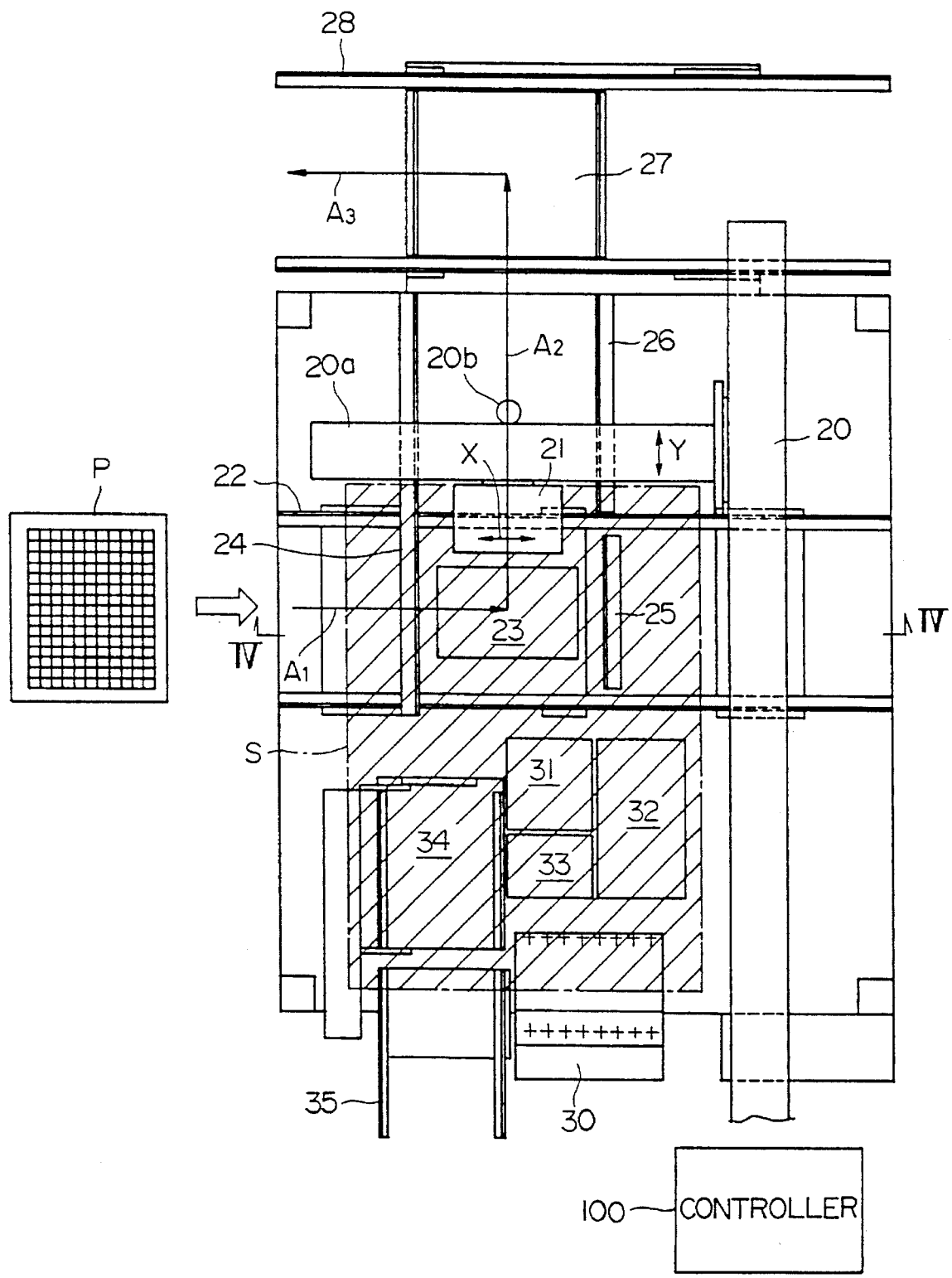
FIG. 4A is a schematic plan view showing an apparatus according to an embodiment of the present invention.

FIG. 4A is a general diagram showing an apparatus for assembling an electronic component according to an embodiment of the present invention. This apparatus is adapted to assemble a ladder-type filter which is similar to that shown in FIGS. 1 and 2.

Figure 4B:
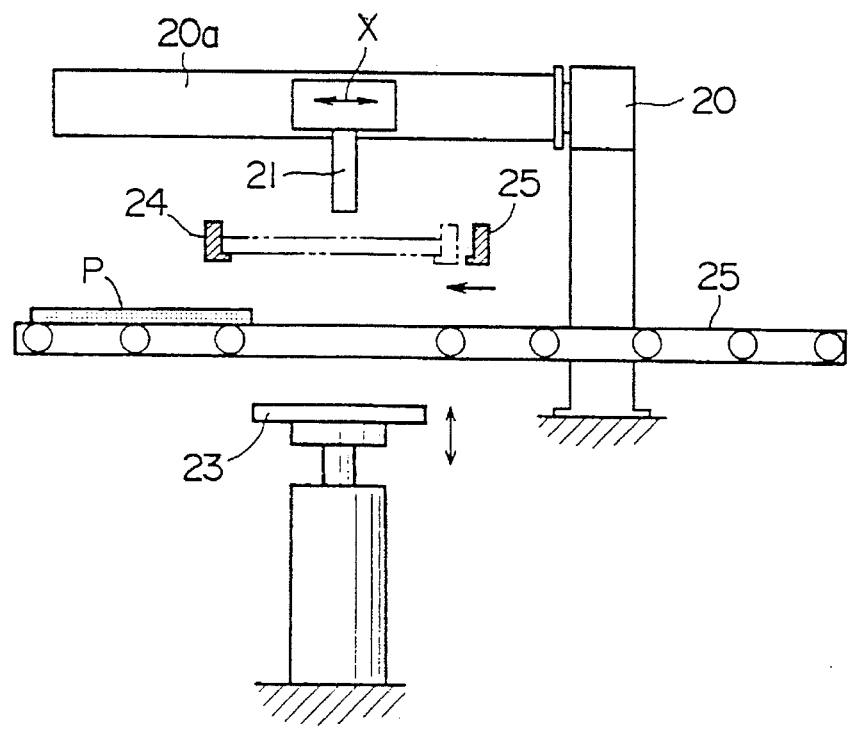
FIG. 4B is a sectional view taken along the line IV—IV in FIG. 4A.
Figure 4C:
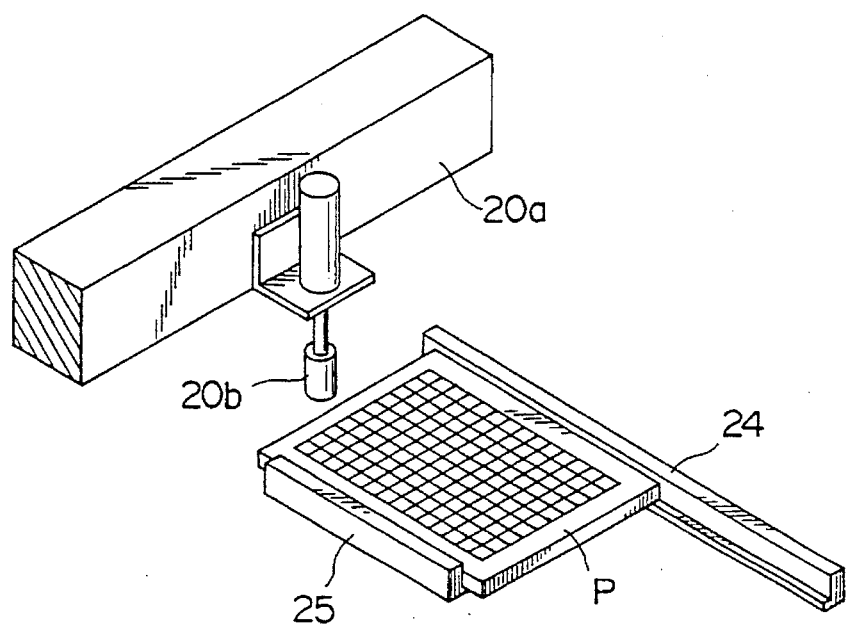
FIG. 4C is a perspective view showing a pusher for pushing a pallet.

Referring to FIGS. 4A and 4B, the apparatus comprises an X-Y robot 20 which has an arm 20a being movable in a direction Y and a chuck hand 21 being movable along the arm 20a in a direction X. Therefore, the chuck hand 21 is freely movable in a working area S shown by slant lines. A pallet P holding a number of parts as described later is first conveyed into the working area S by a carrier conveyor 22 as shown by an arrow $A_1$, and then lifted up from the conveyor 22 by a lifter 23. Next, the pallet P is pushed by a movable rail 25 toward a fixed rail 24 so as to be supported therebetween. At this position, the parts are taken out from the pallet P by the chuck unit 21. After all of the parts are taken out from the pallet P, a pusher 20b which is provided on the arm 20a of the robot 20 comes down and pushes a rear end of the vacated pallet P along the rails 24 and 25 in a direction $A_2$ as shown in FIG. 4C. After the pallet P is further pushed along the rails 24 and 26 by the pusher 20b, the pallet P stops on a lifter 27 provided on terminating ends of the rails 24 and 26. And then, the pallet P is brought down by the lifter 27 so as to be placed on a return conveyor 28 and conveyed in the direction shown by an arrow $A_3$.

An element-supply unit 30 for supplying the resonators 2–5 one by one, an assembly jig 31, a cover sheet fitting unit 32 for fitting the cover sheet 11 to the case 1, an NG detection section 33 for detecting defectives, and a discharge section 34 for introducing a discharge jig G storing assembled products F into a container box 82 are also located in the working area S. The container box 82 is carried out by a discharge conveyor 35.

The respective sections of the aforementioned apparatus are integratedly controled by a controller 100.

Figure 1:
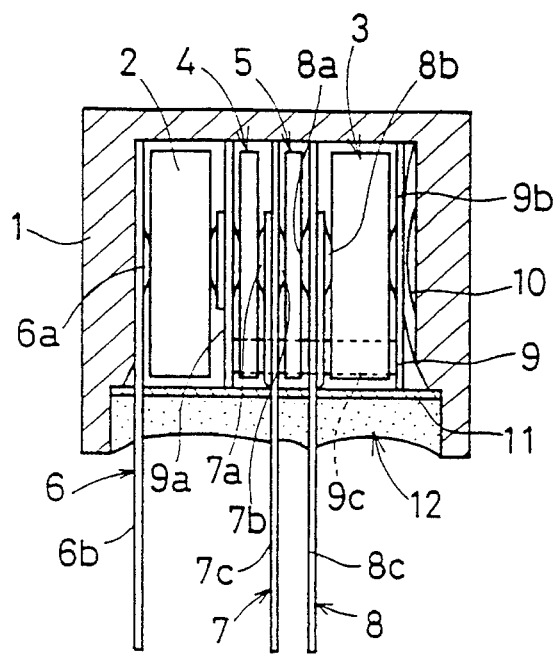
FIG. 1 is a sectional view showing a conventional four-element ladder-type filter.
Figure 2:
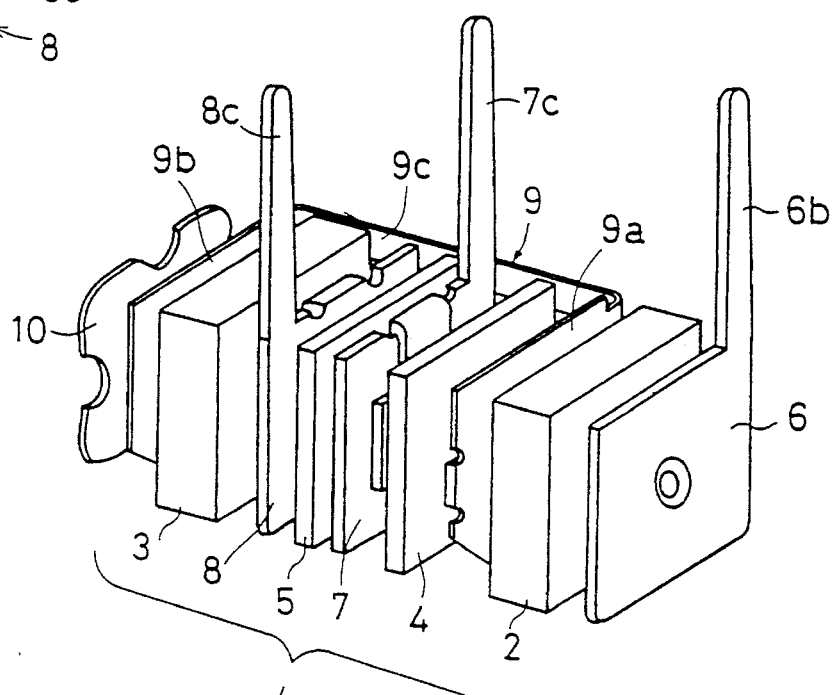
FIG. 2 is an exploded perspective view of the filter shown in FIG. 1.
Figure 2:
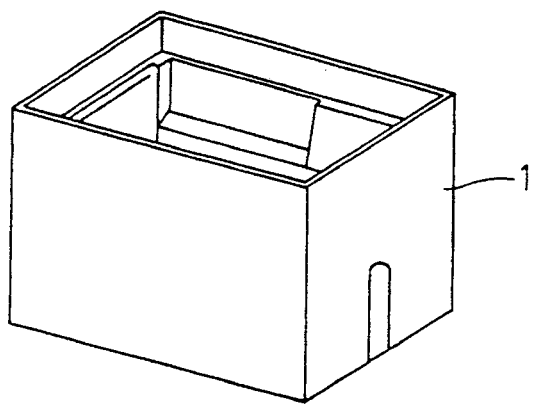
Figure 3:
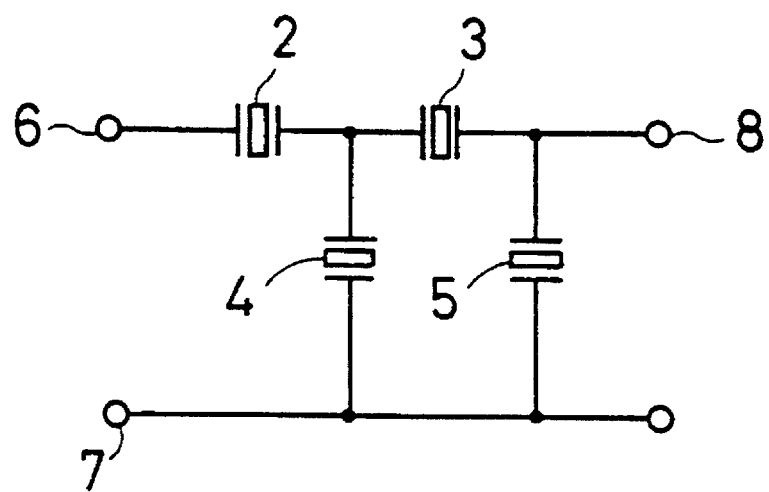
FIG. 3 is an electric circuit diagram of the filter shown in FIG. 1.
Figure 5:
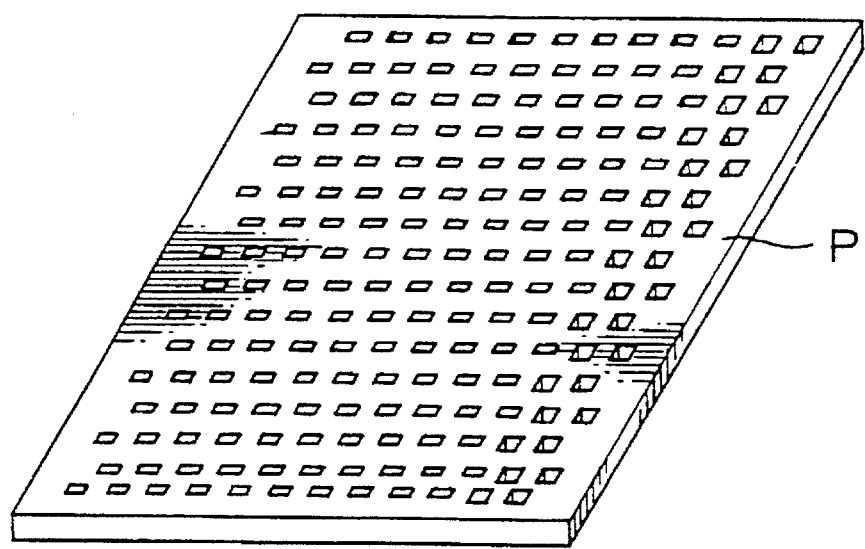
FIG. 5 is a perspective view showing the pallet.
Figure 6:
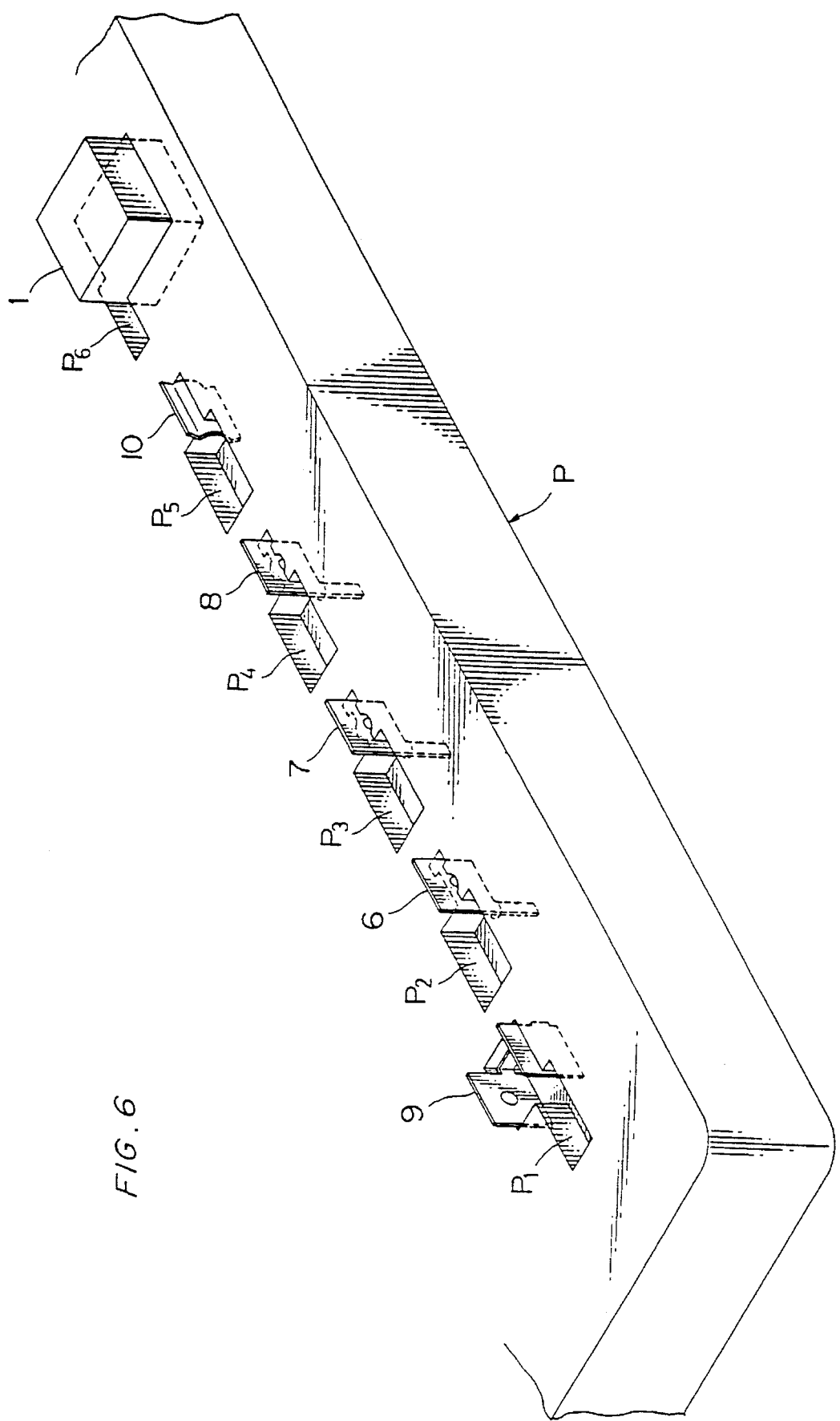
FIG. 6 is a partially enlarged perspective view showing the pallet shown in FIG. 5.

As shown in FIGS. 5 and 6, the pallet P is a plate which comprises a number of cavities $P_1$–$P_6$ formed on an upper surface thereof for receiving respective parts separately in constant arrangement. The internal connection terminal plate 9, the input terminal plate 6, the ground terminal plate 7, the output terminal plate 8, the plate spring 10 and the case 1 as shown in FIGS. 1 and 2, are inserted and vertically held in the cavities $P_1$–$P_6$ respectively. When the parts are thus inserted in this pallet P, upper halves of the parts protrude from the upper surface of the pallet P.

The respective sections of the aforementioned apparatus are now described in detail.

Figure 7:
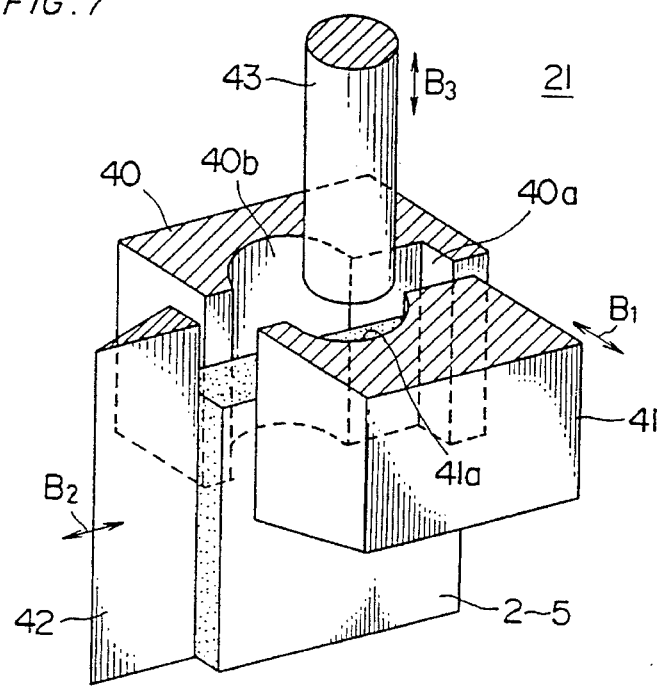
FIG. 7 is a perspective view showing a chuck hand.

As shown in FIG. 7, the chuck hand 21 of the robot 20 comprises a fixed pawl 40 for holding one major surface of each part such as the resonator, the terminal plate or the case, a first movable pawl 41 which moves along the direction $B_1$ for holding the other major surface of each part, a second movable pawl 42 which moves along the direction $B_2$ perpendicular to the direction $B_1$, and an insertion pusher 43 which is movable in the vertical direction $B_3$. The fixed pawl 40 is provided with a stopper surface 40a for positioning a rear edge of each part, and a vertical groove 40b which can be passed through by the pusher 43. The first movable pawl 41 is also provided on its inner surface with a vertical groove 41a corresponding to the groove 40b. The second movable pawl 42, which is used to push a front edge of each part against the stopper surface 40a of the fixed pawl 40 for correctly positioning the part, has a wedge-shaped cross-sectional surface. The second movable pawl 42, which extends downwardly beyond the pawls 40 and 41, also serves as a guide for inserting the resonators 2–5 between the terminal plates 6–9, as hereinafter described. The pusher 43 is used to downwardly push each part, which is chucked by the three pawls 40, 41 and 42.

Figure 8A:
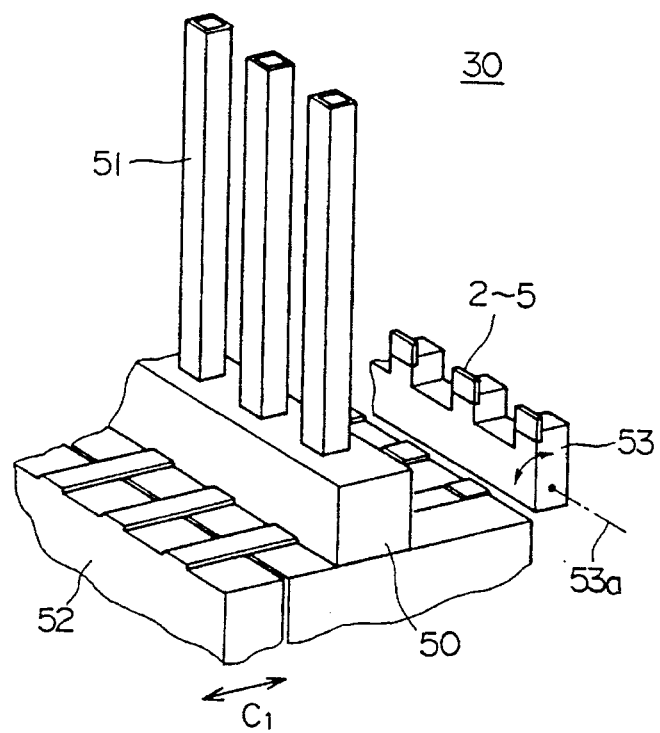
FIG. 8A is a perspective view showing an element-supply unit.

As shown in FIGS. 8A and 8B, the element-supply unit 30 comprises a body 50 and a plurality of cassettes 51 which stand uprightly on the body 50, and a pusher 52 which moves along the direction $C_1$. A number of resonators 2–5 of the same type are stacked in each of the cassettes 51. First, resonators 2–5 come down from lower ends of the cassettes 51 in front of the pusher 52, and then are pushed forwardly one by one by the pusher 52 to the forward end of the body 50. Next, the resonators 2–5 are sucked by a vacuum suction member 53 so as to be upwardly rotated about an axis 53a by about 90 degrees. Thereafter, the resonators 2–5 are chucked by the chuck hand 21, and carried into the assembly jig 31. When the cassettes 51 are vacated, they can be easily exchanged by new ones.

Figure 9:
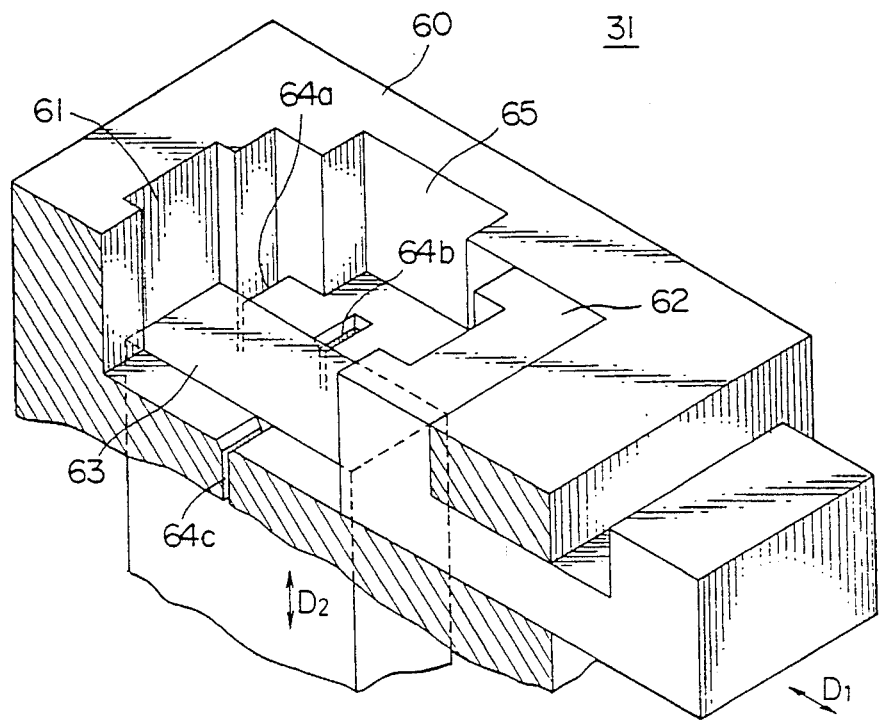
FIG. 9 is a perspective view showing an assembly jig.
Figure 10:
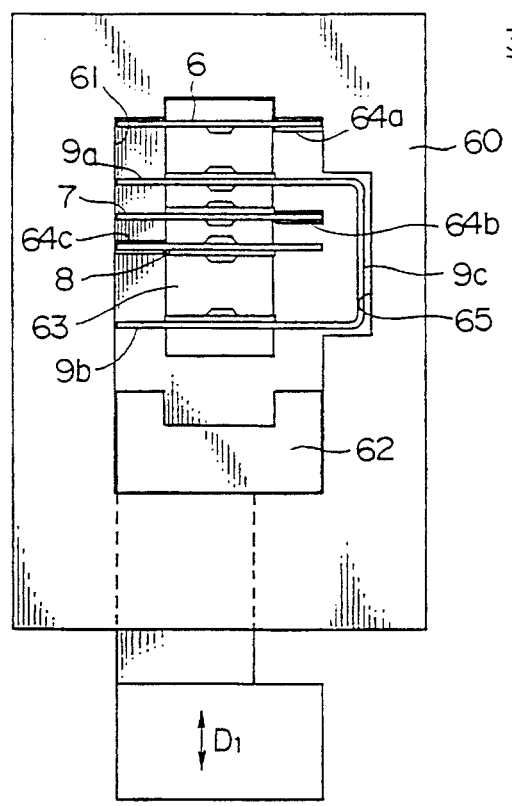
FIG. 10 is a plan view showing the assembly jig in FIG. 9 receiving terminal plates.

As shown in FIGS. 9 and 10, the assembly jig 31 is provided with a base 60 having a cavity 61 for receiving parts, and a presser 62 which is movable along a horizontal direction $D_1$ is arranged on one end side of the cavity 61. The depth of the cavity 61 is set to be longer than half of the height of the resonators 2–5 and shorter than the height thereof. An ejector 63, which is vertically movable along a direction $D_2$, is arranged at a central portion of a bottom of the cavity 61, and lead portion receiving holes 64a–64c which have tapered openings at the top thereof are vertically formed beside the ejector 63. When lead portions 6b, 7c and 8c of the terminals 6–8 are inserted in the holes 64a–64c respectively, the terminals 6–8 are held self-sustainably. An escape portion 65 is provided on one side surface of the cavity 61 to receive the coupling portion 9c of the internal connection terminal 9. The terminals 6–9 are located on constant positions by inner side surfaces of the cavity 61, the holes 64a–64c and the escape portion 65.

An operation for assembling the respective parts in the assembly jig 31 is now described.

Figure 11:
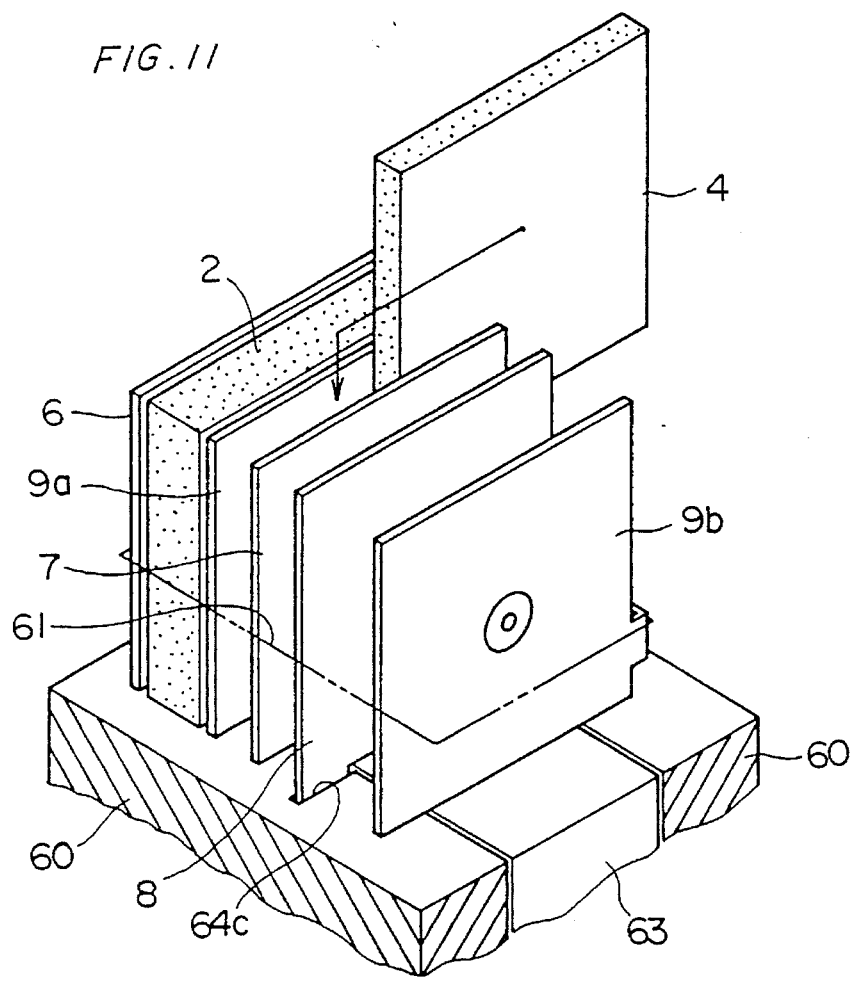
FIG. 11 is a perspective view showing an operation for inserting a resonator between terminal plates.
Figure 12A:
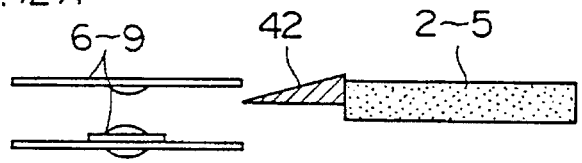
FIGS. 12A and 12B are plan views showing an operation for inserting a resonator between terminal plates.
Figure 12B:
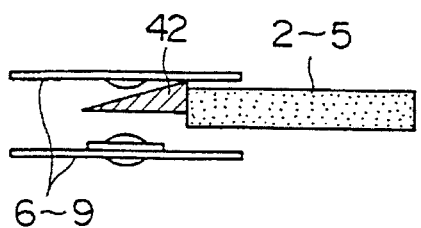

First, the terminals 6–9 which are taken out from the pallet P by the chuck hand 21 of the robot 20 are inserted in the cavity 61 of the assembly jig 31 (see FIG. 10). Then the resonators 2–5 which are carried from the element-supply unit 30 by the chuck hand 21 are inserted between the terminals 6–9 one by one. In particular, as shown in FIG. 11, the resonators 2–5 are laterally inserted between the terminals 6–9 along the upper surface of the base 60, and then the resonators 2–5 are downwardly pushed by the pusher 43 when they reach the position corresponding to the cavity 61. At this time, the terminals 6–9 which are already assembled in the assembly jig 31 self-sustainably may be slightly inclined or slanted so as to hinder the insertion of the resonators 2–5. However, since the second pawl 42 of the chuck hand 21 having a wedge-shaped section separates the terminals 6–9 from each other as shown in FIGS. 12A and 12B, it is possible to smoothly insert the resonators 2–5 between the terminals 6–9. When the resonators 2–5 are inserted, electrode surfaces thereof are not damaged since no compressive force acts between the terminals 5–9. After the resonators 2–5 are inserted in the aforementioned manner, the plate spring 10 is inserted in a clearance between the portion 9b of the terminal plate 9 and the presser 62.

Figure 13A:
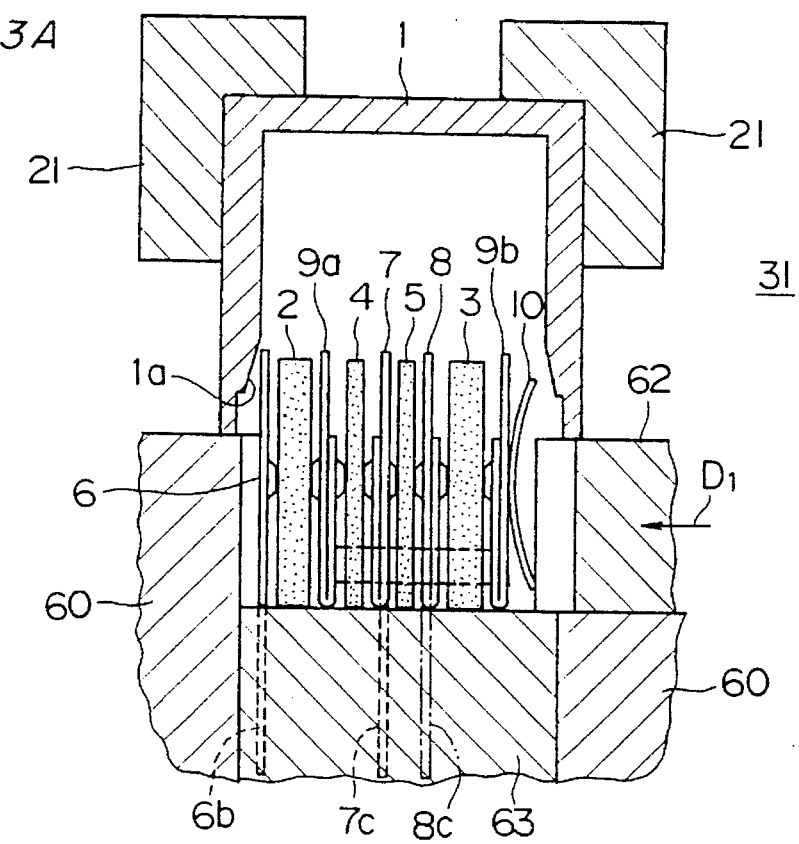
FIGS. 13A and 13B are sectional views of the assembly jig in FIG. 9 showing an operation for inserting parts in a case.
Figure 13B:
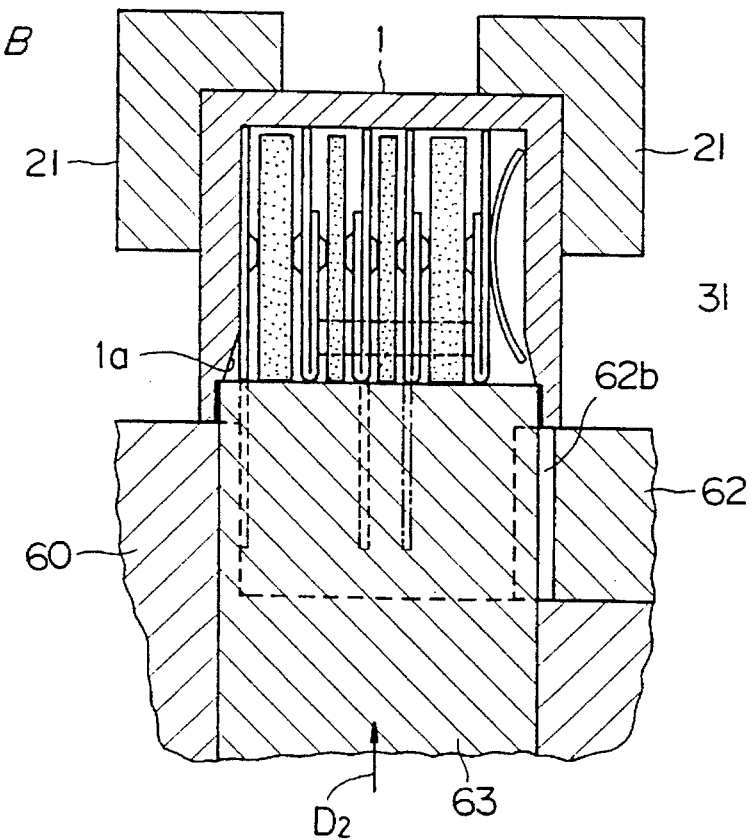

After all parts are assembled in the cavity 61 of the assembly jig 31, the parts are sidewardly compressed by the presser 62 as shown in FIG. 13A, so that the overall thickness of the parts is smaller than the inner size of the case 1. Then, the case 1 is carried from the pallet P onto the assembly jig 31 by the chuck hand 21, and located on a position for covering all parts which are projected on the base 60. Then, the ejector 63 is upwardly moved as shown in FIG. 13B so as to simultaneously insert all parts in the case 1. At this time, the parts are smoothly inserted due to an inclined surface 1a which is formed in an opening of the case 1. Further, the electrode surfaces of the resonators 2–5 are not damaged since the resonators 2–5 are not in sliding contact with the terminals 6–9.

Figure 14:
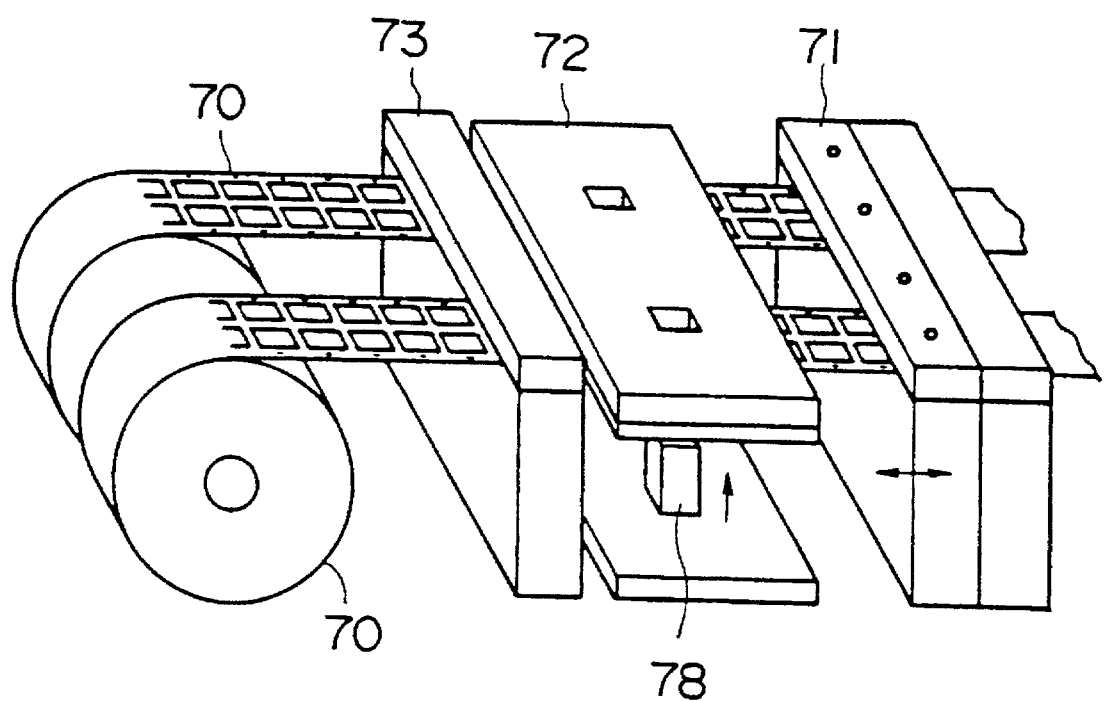
FIG. 14 is a perspective view showing a cover sheet fitting unit.
Figure 15:
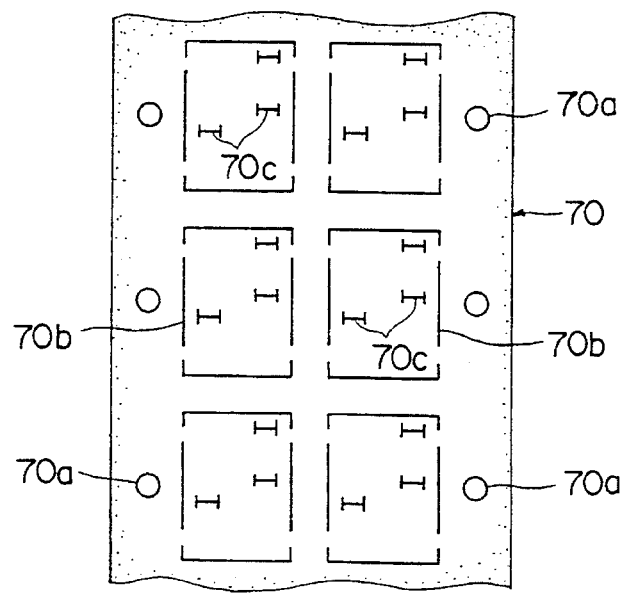
FIG. 15 is a plan view showing a paper tape.

After the parts are inserted in the case 1 in the aforementioned manner, the case 1 which is chucked by the chuck hand 21 is carried to the cover sheet fitting unit 32. As shown in FIG. 14, the cover sheet fitting unit 32 comprises paper tapes 70 which are wound in the form of rolls, a feeder 71 which delivers the tapes 70 in a stepwise manner, a punching machine 72 which punches the tapes 70 into the cover sheets 11 and inserts each of the cover sheets 11 in the case 1, and a brake 73. The brake 73, arranged in front of the punching machine 72, prevents the tapes 70 from loosening. As shown in FIG. 15, each tape 70 is provided on both sides with sprocket holes 70a at regular intervals, and perforations 70b are provided in correspondence to the sprocket holes 70a to facilitate punching of the tapes 70. Three slits 70c are provided inside the perforations 70b for receiving the lead portions 6b, 7c and 8c of the terminals 6–8.

Figure 16:
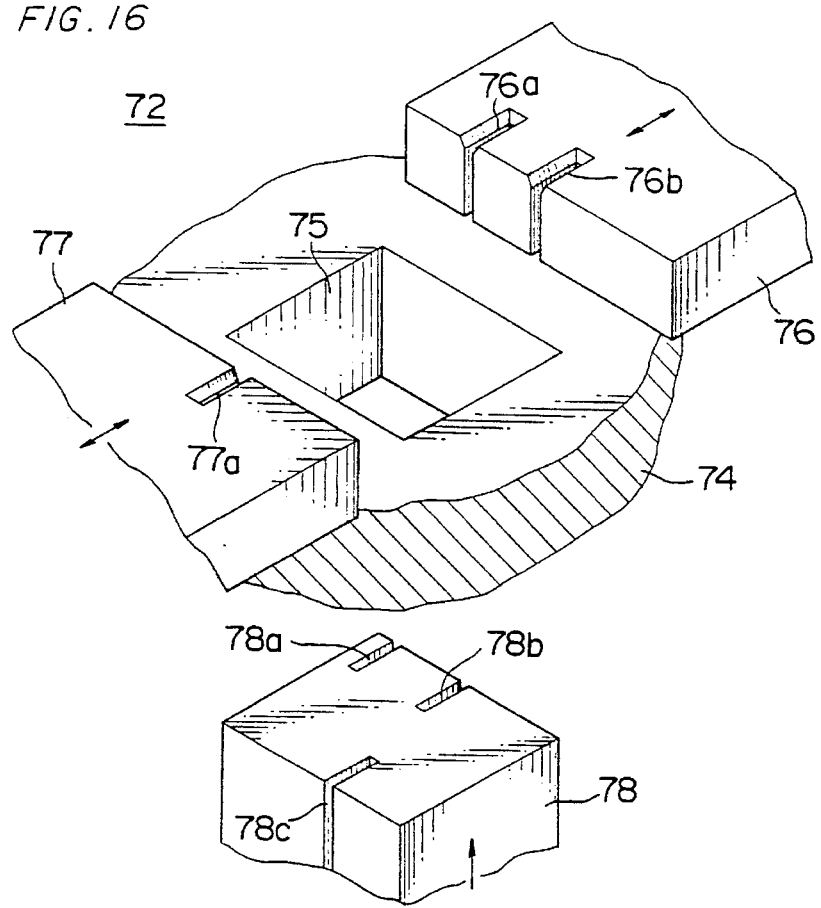
FIG. 16 is a perspective view showing a principal part of a punching machine.

As shown in FIG. 16, the punching machine 72 comprises a die 74 having an opening 75 whose outline corresponds to the perforations 70b, a pair of guide plates 76 and 77 which are horizontally slidable along the upper surface of the die 74, and a punch 78 which can pass through the opening 75 of the die 74. Each tape 70 is supplied along the lower side of the die 74. The guide plates 76 and 77 are provided at the forward ends thereof with grooves 76a 76b and 77a for holding the lead portions 6b, 7c and 8c of the terminals 6–8, thereby preventing the lead portions 6b, 7c and 8c from bending when they are inserted in the slits 70c. The punch 78 is also provided with grooves 78a–78c corresponding to the lead portions 6b, 7c and 8c on both side surfaces thereof.

The operation of the punching machine 72 is now described with reference to FIGS. 17A–17C.

Figure 17A:
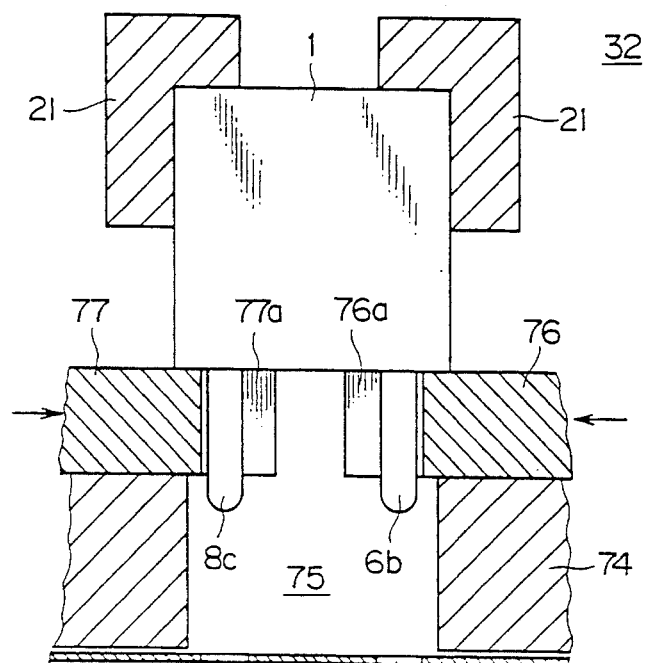
FIGS. 17A, 17B and 17C are sectional views showing an operation of the punching machine shown in FIG. 16.

As shown in FIG. 17A, the guide plates 76 and 77 are inwardly moved and the chuck hand 21 chucking the case 1 is downwardly moved to insert the lead portions 6b, 7c and 8c in the grooves 76a, 76b and 77a respectively.

Figure 17B:
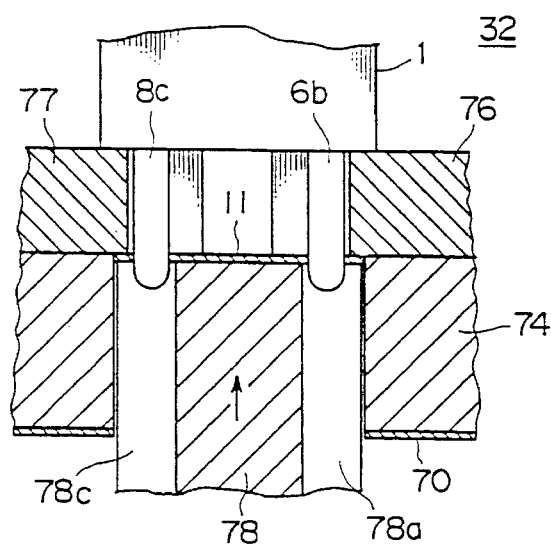

Then, the punch 78 is upwardly moved to punch the tape 70 along the perforations 70b to obtain a cover sheet 11, and hold the cover sheet 11 by the guide plates 76 and 77 and the punch 78, as shown in FIG. 17B. At this time, forward ends of the lead portions 6b, 7c and 8c are inserted in the slits 70c of the cover sheet 11.

Figure 17C:
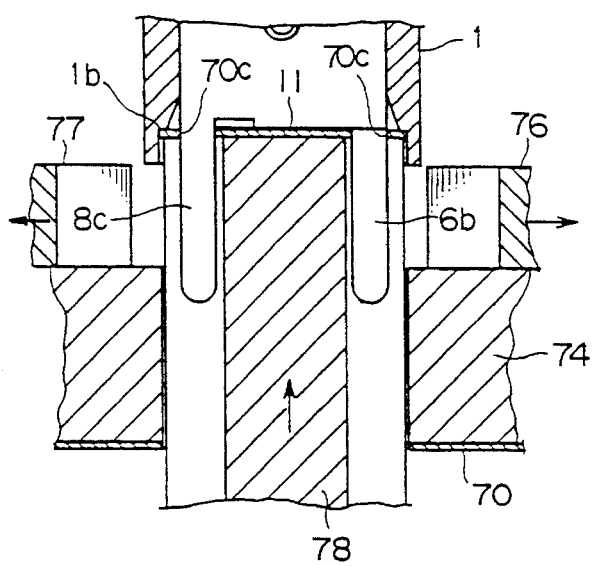

Then, the guide plates 76 and 77 are outwardly moved and the punch 78 is further upwardly moved as shown in FIG. 17C. Thus, the cover sheet 11 is upwardly slid along the lead portions 6b, 7c and 8c so as to be inserted in the opening of the case 1. The cover sheet 11 is assembled in the case 1 when an outer peripheral edge of the sheet 11 is stopped at a step portion 1b provided in the opening of the case 1.

Figure 18:
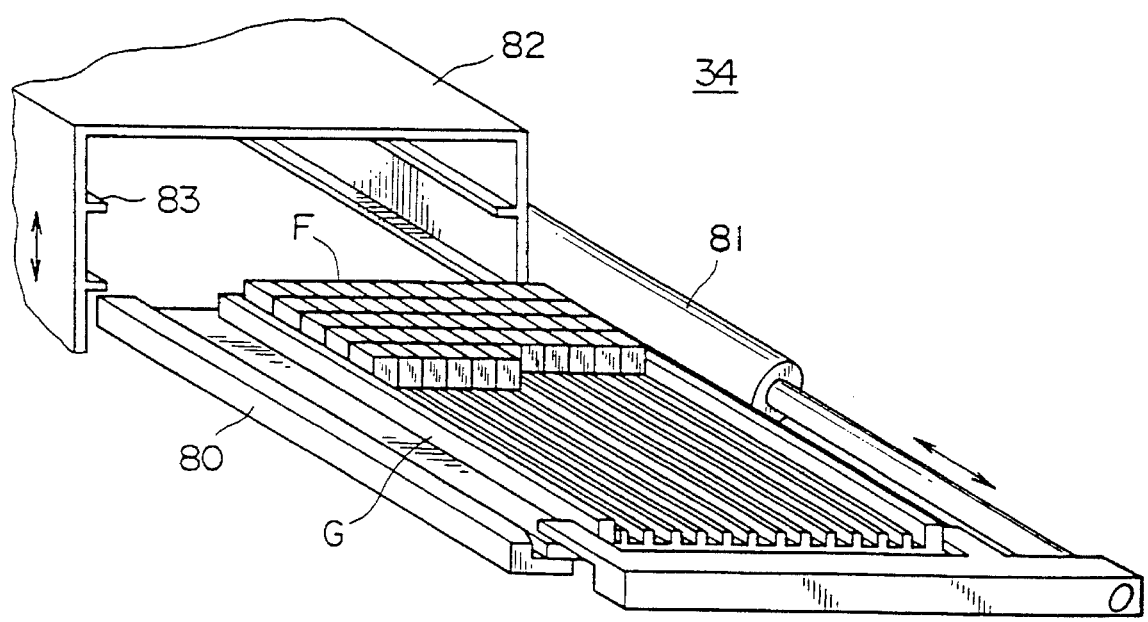
FIG. 18 is a perspective view showing a discharge unit.

After the resonators 2–5, the terminals 6–9, the plate spring 10 and the cover sheet 11 are assembled in the case 1 in the aforementioned manner, the assembled products F are arranged on the discharge jig G of the discharge unit 34 shown in FIG. 18. The discharge jig G, which is slidable on rails 80, are inserted into the container box 82 by a cylinder 81 so as to be placed on a rack 83. After one jig G is placed on a rack 83, the box 82 is vertically moved stepwisely so that the next jig G is placed on the next rack 83. The assembled products F stored in the container box 82 are carried to a next sealing step, where the opening of each case 1 is sealed with resin 12 to obtain a final product.

The present invention is not restricted to the aforementioned embodiment, but various modifications are available, as a matter of course.

For example, the X–Y robot can be replaced by any means so far as it is able to transfer the chuck hand to correct positions in a certain working area. Moreover, the chuck hand is not restricted to the one as shown in FIG. 7.

Though cover sheets are punched out from a tape and simultaneously inserted in the cases in the aforementioned embodiment, independent cover sheets which are previously prepared may be inserted in the cases one by one. However, since the cover sheets are easily set at correct positions in the embodiment, assembling efficiency is much improved.

Although the terminal plates, the plate springs and the cases are supplied by the pallet in the aforementioned embodiment, the resonators may also be inserted therein. According to the aforementioned embodiment, the resonators are supplied from the element-supply unit which is independent of the pallet, for the reason that the resonators are generally varied with types of filters whereas the terminals, the plate springs and the cases are generally employed in common to various types of the filters.

Further, the present invention is not restricted to a ladder-type filter, but is also applicable to an electronic component comprising a plurality of inner parts held under pressure in a case.

Furthermore, the plate spring can be replaced by a rubber plate as a cushion member. Also, the cushion member can be eliminated if at least one of the terminal plates is made of a bent spring plate.

As the above description clearly shows, the respective parts are assembled in the assembly jig first, and then these parts are compressed and inserted into the case all at once. By this compressed insertion, the assembling efficiency is highly improved as compared with the one-by-one insertion.

Moreover, since all of the parts are inserted into the case simultaneously, the parts are not in sliding contact with other parts, whereby the parts are not damaged and reliability is improved.

Further, since the operations such as assembling the parts in the assembly jig, inserting the parts into the case, and applying a cover sheet at the opening of the case can be carried out automatically, the working efficiency is highly improved as compared with the manual assembly.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of assembling an electronic component having a plurality of parts being held under pressure and stored in a case, each part having a thickness which defines a direction of thickness, said case defining an inner dimension thereof, said method comprising the steps of:

carrying said parts and said case into a working area in which a chuck means is movable and an assembly means is arranged;

chucking said parts by said chuck means and inserting said parts into said assembly means so as to align said parts along said direction of thickness thereof;

compressing said parts in said assembly means along said direction of thickness so that an overall thickness of said parts is smaller than said inner dimension of said case;

setting said case on said assembly means by said chuck means so that an opening of said case is disposed for receiving said parts; and inserting said parts while compressed by said assembly means into said case simultaneously.

2. A method of assembling an electronic component in accordance with claim 1, wherein said parts comprise a plurality of terminal plates and an element which is arranged between said terminal plates.

3. A method of assembling an electronic component in accordance with claim 2, further comprising the steps of:

carrying a pallet having a plurality of cavities for holding said terminal plates and said case respectively into said working area;

taking out said terminal plates from said pallet by said chuck means and inserting said terminal plates into said assembly means; and taking out said element from an element supply means arranged in said working area and inserting said element between said terminal plates in said assembly means by said chuck means.

4. A method of assembling an electronic component in accordance with claim 2, wherein:

said parts further comprises a cushion member for bringing said terminal plates into pressure contact with said element to be electrically connected.

5. A method of assembling an electronic component in accordance with claim 4, further comprising the steps of:

carrying a pallet having a plurality of cavities for holding said terminal plates, said cushion member and said case respectively into said working area;

taking out said terminal plates from said pallet by said chuck means and inserting said terminal plates into said assembly means;

taking out said element from an element supply means arranged in said working area and inserting said element between said terminal plates in said assembly means by said chuck means; and taking out said cushion member from said pallet and inserting said cushion member into said assembly means by said chuck means.

6. A method of assembling an electronic component in accordance with claim 4, wherein:

said parts further comprise a cover sheet for covering an opening of said case in which said terminal plates, said element and said cushion member are inserted in pressure contact with each other, and wherein cover sheet fitting means is arranged in said working area for punching a tape to form said cover sheet and for inserting said cover sheet into said case so as to cover said opening.

7. A method of assembling an electronic component in accordance with claim 1, wherein:

said chuck means comprises a chuck hand for chucking said parts and said case, and a transfer means for transferring said chuck hand within said working area.

8. An apparatus for assembling an electronic component having a plurality of parts being held under pressure and stored in a case, each part having a thickness which defines a direction of thickness, said case defining an inner dimension thereof, said apparatus comprising:

assembly means arranged in said working area for assembling said parts therein;

chuck means being movable in said working area for inserting said parts into said assembly means so as to align said parts along said direction of thickness thereof, and for setting said case on said assembly means so that an opening of said case is disposed for receiving said parts;

press means associated with said assembly means for compressing said parts inserted therein along said direction of thickness so that an overall thickness of said parts is smaller than said inner dimension of said case; and ejector means associated with said assembly means for simultaneously inserting said parts from said assembly means into said case.

9. An apparatus for assembling an electronic component in accordance with claim 8, wherein said parts comprise a plurality of terminal plates and an element which is arranged between said terminal plates.

10. An apparatus for assembling an electronic component in accordance with claim 9, said apparatus further comprising:

a pallet having a plurality of cavities for holding said terminal plates and said case respectively so as to be chucked by said chuck means;

conveyor means for carrying said pallet into said working area; and element-supply means arranged in said working area for supplying said element so as to be chucked by said chuck means.

11. An apparatus for assembling an electronic component in accordance with claim 9, wherein:

said parts further comprise a cushion member for bringing said terminal plates into pressure contact with said element to be electrically connected.

12. An apparatus for assembling an electronic component in accordance with claim 11, said apparatus further comprising:

a pallet having a plurality of cavities for holding said terminal plates, said case and said cushion member respectively so as to be chucked by said chuck means;

conveyor means for carrying said pallet into said working area;

element-supply means arranged in said working area for supplying said element so as to be chucked by said chuck means.

13. An apparatus for assembling an electronic component in accordance with claim 11, wherein:

said parts further comprise a cover sheet for covering an opening of said case in which said terminal plates, said element and said cushion member are inserted in pressure contact with each other, and wherein cover sheet fitting means is arranged in said working area for punching a tape to form said cover sheet and for inserting said cover sheet into said case so as to cover said opening.

14. An apparatus for assembling an electronic component in accordance with claim 8, wherein:

said chuck means comprises a chuck hand for chucking said parts and said case, and transfer means for transferring said chuck hand within said working area.

* * * * *